US009606177B2

(12) United States Patent
Bailey et al.

(10) Patent No.: US 9,606,177 B2
(45) Date of Patent: Mar. 28, 2017

(54) SCAN FLIP-FLOP CIRCUIT WITH DEDICATED CLOCKS

(71) Applicant: Advanced Micro Devices, Inc., Sunnyvale, CA (US)

(72) Inventors: Daniel W. Bailey, Austin, TX (US); Abhishek Sharma, Austin, TX (US); Michael Q. Co, Austin, TX (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 0 days.

(21) Appl. No.: 14/716,215

(22) Filed: May 19, 2015

(65) Prior Publication Data
US 2016/0341793 A1 Nov. 24, 2016

(51) Int. Cl.
*H03K 3/00* (2006.01)
*G01R 31/3177* (2006.01)
*G01R 31/317* (2006.01)

(52) U.S. Cl.
CPC ... *G01R 31/3177* (2013.01); *G01R 31/31727* (2013.01)

(58) Field of Classification Search
None
See application file for complete search history.

(56) References Cited

U.S. PATENT DOCUMENTS

| 6,725,406 | B2* | 4/2004 | Kakizawa | G01R 31/31853 714/727 |
| 7,301,373 | B1 | 11/2007 | Bailey et al. | |
| 8,072,252 | B2 | 12/2011 | Bailey | |
| 9,435,860 | B2* | 9/2016 | Whetsel | G01R 31/3172 |
| 2014/0149813 | A1* | 5/2014 | Giles | G01R 31/31855 714/727 |
| 2014/0189453 | A1* | 7/2014 | Gurumurthy | G01R 31/31857 714/727 |

* cited by examiner

*Primary Examiner* — Long Nguyen
(74) *Attorney, Agent, or Firm* — Polansky & Associates, P.L.L.C.; Paul J. Polansky

(57) ABSTRACT

In one form, a scan flip-flop includes a clock gating cell and a dedicated clock flip-flop. The clock gating cell provides an input clock input signal as a scan clock signal when a scan shift enable signal is active, and provides the input clock signal as a data clock signal when the scan shift enable signal is inactive. The dedicated clock flip-flop stores a data input signal and provides the data input signal, so stored, as a data output signal in response to transitions of the data clock signal, and stores a scan data input signal and provides the scan data input signal, so stored, as the data output signal in response to transitions of the scan clock signal. The clock gating cell may further provide the input clock signal as the data clock signal when both a scan shift enable signal is inactive and a data enable signal is active.

20 Claims, 10 Drawing Sheets

SCAN FLIP-FLOP CIRCUIT WITH DEDICATED CLOCKS

FIELD

This disclosure relates generally to digital logic circuits, and more specifically to high-speed flip-flop circuits.

BACKGROUND

Flip-flops are used as building blocks in a variety of sequential logic circuits such as registers. For example, many modern microprocessors use a technique known as pipelining in which the processing of an instruction is broken down into several smaller sub-tasks, each of which can be performed within one clock cycle. Pipelined microprocessors include dedicated circuitry to perform each sub-task, and different instructions are processed at each subtask in a sequential, or pipelined, fashion. By using this technique, pipelined microprocessors are able to achieve high effective instruction throughput even though only a portion of any individual instruction is processed per clock cycle in one of the pipeline stages.

Pipelined microprocessors use pipeline registers to store the results of an operation at a particular pipeline stage and provide these results to a subsequent pipeline stage. The speed of a pipelined microprocessor is limited by the amount of time it takes to perform the functions of a pipeline stage as well as to store the results stably in the pipeline register. Thus the speed in which the microprocessor clock can be set at is limited, in part, by the delay through the pipeline register, and hence the flip-flops that make up the pipeline register.

In addition, many digital logic circuits including pipelined microprocessors use a technique known as boundary scan testing to allow internal nodes to be fully tested so that almost all possible manufacturing defects can be detected. When using boundary scan testing, test data is scanned into a serial chain of scan flip-flops and when the data has been properly aligned in the serial chain, a test controller enables the test and measures the response of the circuit. The controller then scans the data to an output pin so that it can be compared with a response pattern of a correctly fabricated circuit. Scan testing has become a very valuable technique to ensure that complex digital integrated circuits such as pipelined microprocessors are working properly. However adding a scan capability to existing flip-flops used for such purposes as pipeline registers can slow their operation.

There are two known types of scan flip-flops: multiplexed data (MUXD) and level-sensitive scan design (LSSD). LSSD is generally faster than MUXD because it avoids the use of an extra multiplexer in the data input path. However LSSD has two main problems. First, LSSD is not an accepted industry standard, and thus not all electronic design automation (EDA) tool vendors support it, making it harder to create and electrically simulate LSSD designs. Second, LSSD requires more circuit area than MUXD. Thus, neither approach is ideal.

Figure 1:
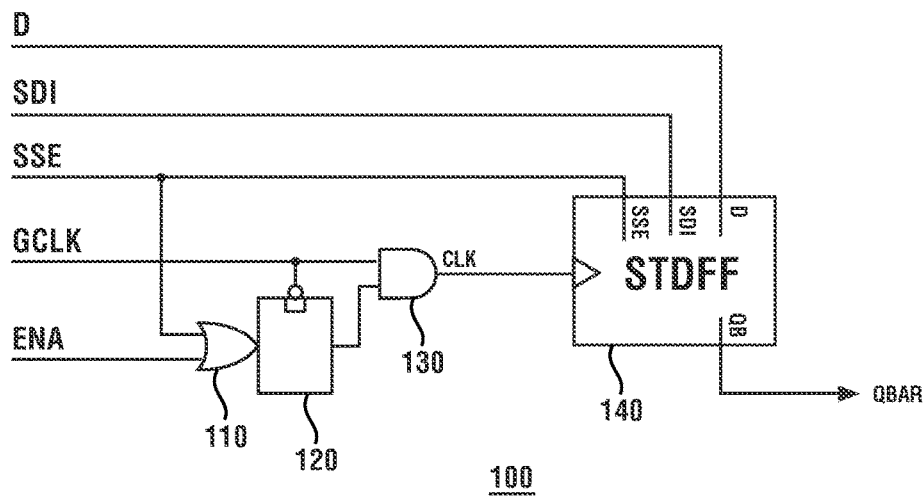
FIG. 1 illustrates in partial block diagram and partial logic diagram form a scan flip-flop known in the prior art.

In the following description, the use of the same reference numerals in different drawings indicates similar or identical items. Unless otherwise noted, the word "coupled" and its associated verb forms include both direct connection and indirect connection by means known in the art, and unless otherwise noted any description of direct connection implies alternate embodiments using suitable forms of indirect connection as well.

DETAILED DESCRIPTION OF ILLUSTRATIVE EMBODIMENTS

In one form, a scan flip-flop includes a clock gating cell and a dedicated clock flip-flop. The clock gating cell provides an input clock input signal as a scan clock signal when a scan shift enable signal is active, and provides the input clock signal as a data clock signal when the scan shift enable signal is inactive. The dedicated clock flip-flop stores a data input signal and provides the data input signal, so stored, as a data output signal in response to transitions of the data clock signal, and stores a scan data input signal and provides the scan data input signal, so stored, as the data output signal in response to transitions of the scan clock signal. The clock gating cell may further provide the input clock signal as the data clock signal when both a scan shift enable signal is inactive and a data enable signal is active. For example, the dedicated clock flip-flop may include a sense amplifier flip-flop, an asymmetric precharged flip-flop (with or without an integral logic function), or a master-slave flip-flop.

In another form, a scan flip-flop includes a clock gating cell and a dedicated clock flip-flop. The clock gating cell has a first input for receiving an input clock input signal, a second input for receiving a scan shift enable signal, a first output for providing the clock input signal as a scan clock signal when the scan shift enable signal is active, and a second output for providing the clock input signal as a data clock signal when the scan shift enable signal is inactive. The dedicated clock flip-flop has a first input for receiving the scan clock signal, a second input for receiving the data clock signal, a third input for receiving a scan data signal, a fourth input for receiving a data input signal, and an output for providing a data output signal as a value of the data input signal at a predetermined transition of the data clock signal, and for providing the data output signal as a value of the scan data signal at a predetermined transition of the scan clock signal.

In yet another form, a method is provided in which an input clock signal and a scan shift enable signal are received. A scan clock signal is generated from the clock input signal when the scan shift enable signal is active. A data clock signal is generated from the clock input signal when the scan shift enable signal is inactive. A data input signal is stored and the data input signal, so stored, is provided as a data output signal in response to transitions of the data clock signal. A scan data input signal is stored and the scan data input signal, so stored, is provided as the data output signal in response to transitions of the scan clock signal.

FIG. 1 illustrates in partial block diagram and partial logic diagram form a scan flip-flop 100 known in the prior art. Scan flip-flop 100 includes an OR gate 110, a latch 120, an AND gate 130, and a flip-flop core 140 labeled "STDFF". OR gate 110 has a first terminal for receiving a scan shift enable signal labeled "SSE", a second input for receiving a data enable signal labeled "ENA", and an output. Latch 120 has a data input connected to the output of OR gate 110, an inverting clock input for receiving a global clock signal labeled "GCLK", and an output. AND gate 130 has a first input for receiving global clock signal GCLK, a second input connected to the output of latch 120, and an output for providing a clock input signal labeled "CLK". Flip-flop core 140 has a data input for receiving a data input signal labeled "D", a scan data input for receiving a scan data input signal labeled "SDI", a scan enable input for receiving scan shift enable signal SSE, and an output for providing a complementary output signal labeled "QB".

In operation, scan flip-flop 100 operates in both a functional operation mode and a scan mode. In the functional operation mode, scan shift enable signal SSE is low and data enable signal ENA is high, causing OR gate 110 to output a logic high, and latch 120 to capture the logic high on the high-to-low transition of global clock signal GCLK. The output of latch 120 enables AND gate 130 to operate as a non-inverting buffer and to provide global clock signal GCLK as clock input signal CLK to flip-flop core 140. Since scan shift enable signal SSE is low, flip-flop core 140 latches data input signal D on each low-to-high transition of global clock signal GCLK and provides complementary output signal QB in response to a complement of the stored value of data input signal D.

In the scan mode, scan shift enable signal SSE is high and data enable signal ENA is low, causing OR gate 110 to output a logic high, and latch 120 to switch high on the low-to-high transition of global clock signal GCLK. The output of latch 120 enables AND gate 130 to operate as a non-inverting buffer and to provide global clock signal GCLK as clock input signal CLK to flip-flop core 140. Since scan shift enable signal SSE is high, flip-flop core 140 latches scan data input signal SDI on each low-to-high transition of global clock signal GCLK and provides complementary output signal QB in response to a complement of the stored value of scan data input signal SDI.

Flip-flop core 140 selects between data input signal D and scan data input signal SDI and stores the selected one based on the value of scan shift enable signal SSE, and thus uses a MUXD methodology. As will be seen with specific examples of flip-flop cores below, incorporation of the scan capability in scan flip-flop core 140 increases the delay time because of the selection between data input signal D and scan data input signal SDI and limits the speed of operation of circuits using it such as pipelined microprocessors.

Figure 2:
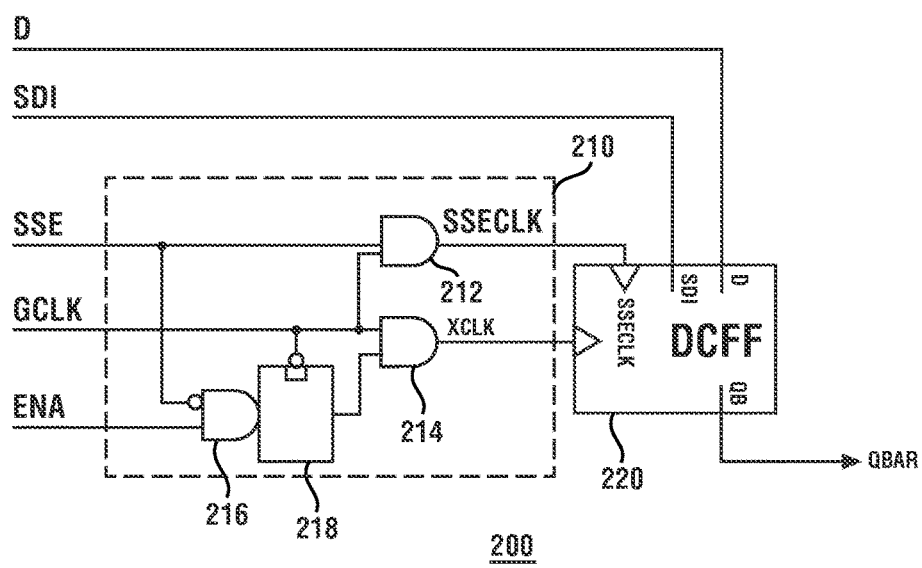
FIG. 2 illustrates in partial block diagram and partial logic diagram form a scan flip-flop circuit with dedicated clocks according to some embodiments.

FIG. 2 illustrates in partial block diagram and partial logic diagram form a scan flip-flop circuit 200 according to some embodiments. Scan flip-flop circuit 200 generally includes a clock gating cell 210 and a dedicated clock flip-flop 220 labeled "DCFF". Clock gating cell 210 includes AND gates 212, 214, and 216 and a latch 218. AND gate 212 has a first input for receiving scan shift enable signal SSE, a second input for receiving global clock signal GCLK, and an output for providing a scan clock signal labeled "SSECLK". AND gate 214 has a first input for receiving global clock signal GCLK, a second input, and an output signal for providing a data clock signal labeled "XCLK". AND gate 216 has a first, inverting input for receiving scan shift enable signal SSE, a second input for receiving data enable signal ENA, and an output. Latch 218 has a data input connected to the output of AND gate 216, an inverting clock input for receiving global clock signal GCLK, and an output connected to the second input of AND gate 214. Dedicated clock flip-flop 220 has a data input for receiving data input signal D, a scan data input for receiving scan data input signal SDI, a scan enable clock input for receiving scan clock signal SSECLK, a data clock input for receiving data clock signal XCLK, and an output for providing complementary output signal QB.

In operation, scan flip-flop circuit 200 operates in both a functional operation mode and a scan mode. In the functional operation mode, scan shift enable signal SSE is low, keeping scan clock signal SSECLK low. When data enable signal ENA is high, the output of AND gate 216 is high, which latch 218 latches on the high-to-low transition of global clock GCLK. The logic high at the output of latch 218 causes AND gate 214 to operate as a non-inverting buffer and to provide global clock signal GCLK as data clock signal XCLK to dedicated clock flip-flop 220. Since scan clock signal SSECLK is low, dedicated clock flip-flop 220 latches data input signal D on each low-to-high transition of data clock signal XCLK and provides complementary output signal QB in response to a complement of the stored value of data input signal D.

In the scan mode, scan shift enable signal SSE is high. Scan shift enable signal SSE overrides data enable signal ENA and causes scan flip-flop circuit 200 to enter the scan mode regardless of the state of data enable signal ENA. Thus on the activation of scan shift enable signal SSE, the output of AND gate 216 goes low. Latch 218 captures the low on the high-to-low transition of global clock signal GCLK. The output of latch 218 disables AND gate 214, which keeps data clock signal XCLK low. Since scan shift enable signal SSE is high, AND gate 212 operates as a non-inverting buffer and provides global clock signal GCLK as scan clock signal SSECLK. Dedicated clock flip-flop 220 latches scan data input signal SDI on each low-to-high transition of global clock signal GCLK and provides complementary output signal QB in response to a complement of the stored value of scan data input signal SDI.

Clock gating cell 210 ensures that both scan clock signal SSECLK and data clock signal XCLK are never simultaneously high.

Because clock gating cell 210 generates dedicated clock signals for functional operation and scan modes, dedicated clock flip-flop 220 can be designed more simply using the smaller circuit area of MUXD techniques while providing speed comparable to that of corresponding LSSD designs.

Note that while clock gating cell 210 is associated with dedicated clock flip-flop 220 to form scan flip-flop circuit 200, clock gating cell 210 can and typically will be associated with and drive many DCFFs. Although there may be changes in the generation of control signals used for different types of DCFFs, they can share the same scan chain as a standard flip-flop and do not require a change in the design for test (DFT) methodology. Various types of dedicated clock flip-flops that can be used as dedicated clock flip-flop 220 and that are MUXD-type flip-flops will now be described.

Figure 3:
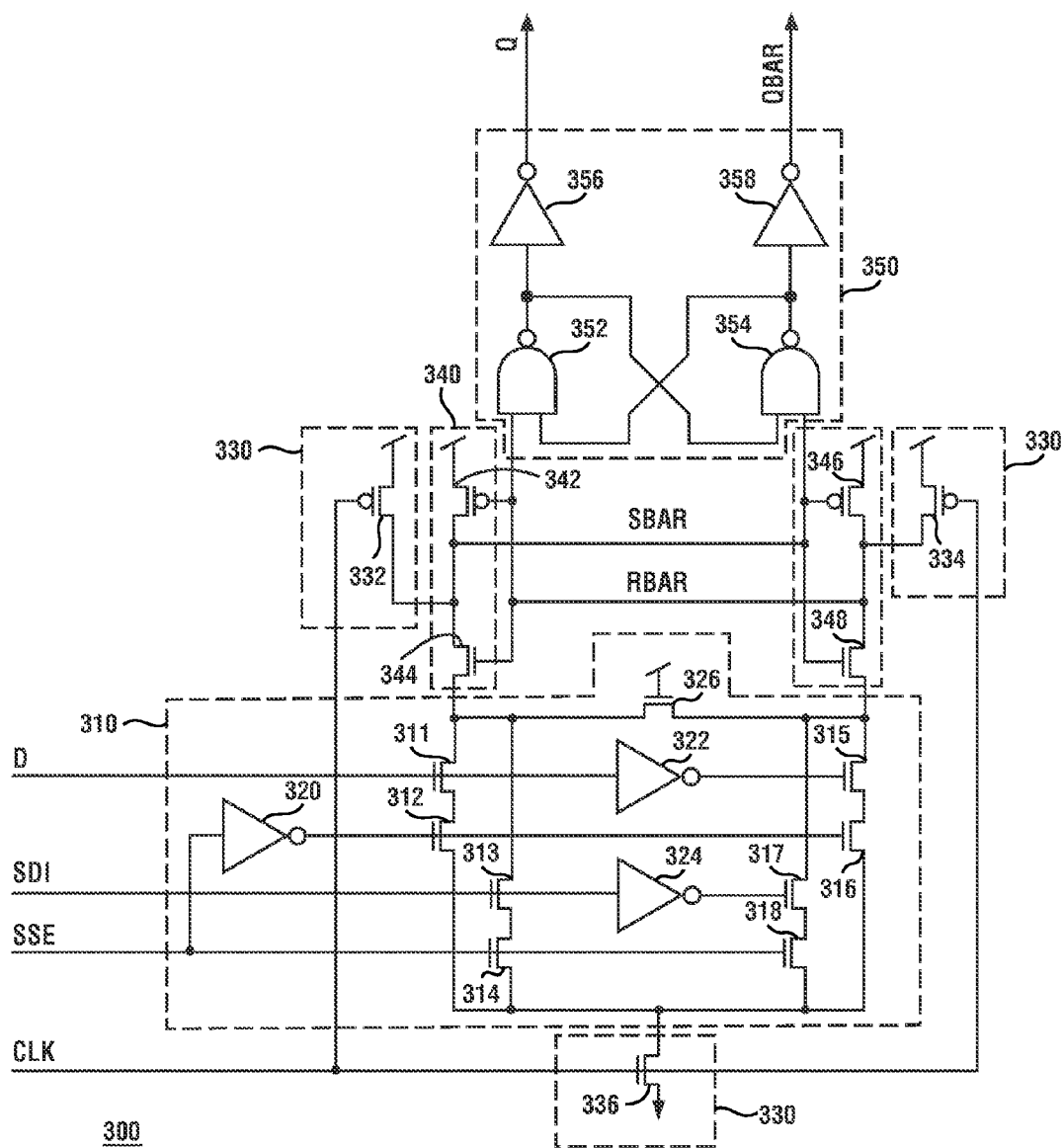
FIG. 3 illustrates in partial logic diagram and partial schematic form a dedicated clock flip-flop of a first type known in the prior art.

FIG. 3 illustrates in partial logic diagram and partial schematic form a flip-flop core 300 of a first type known in the prior art. The first type is known as a sense amplifier flip-flop. Flip-flop core 300 is an STDFF known as a sense amplifier flip-flop and generally includes a data input portion 310, an enable portion 330, a latch portion 340, and an output circuit 350.

Data input portion 310 includes N-channel metal-oxide-semiconductor (MOS) transistors 311-318, inverters 320, 322, and 324, and an N-channel MOS transistor 326. Transistor 311 has a drain, a gate for receiving data input signal D, and a source. Transistor 312 has a drain connected to the source of transistor 311, a gate, and a source. Transistor 313 has a drain connected to the drain of transistor 311, a gate for receiving scan data input signal SDI, and a source. Transistor 314 has a drain connected to the source of transistor 313, a gate for receiving scan shift enable signal SSE, and a source connected to the source of transistor 312. Transistor 315 has a drain, a gate, and a source. Transistor 316 has a drain connected to the source of transistor 315, a gate, and a source connected to the source of transistors 312 and 314. Transistor 317 has a drain connected to the drain of transistor 315, a gate, and a source. Transistor 318 has a drain connected to the source of transistor 317, a gate for receiving scan shift enable signal SSE, and a source connected to the source of transistors 312, 314, and 316. Inverter 320 has an input for receiving scan shift enable signal SSE, and an output connected to the gates of transistors 312 and 316. Inverter 322 has an input for receiving data input signal D, and an output connected to the gate of transistor 315. Inverter 324 has an input for receiving scan data input signal SDI, and an output connected to the gate of transistor 317. Transistor 326 has a first source/drain terminal connected to the drains of transistors 311 and 313, a gate connected to a power supply voltage terminal, and a second source/drain terminal connected to the drains of transistors 315 and 317. The power supply voltage terminal is positive with respect to ground and has a nominal voltage of, for example, 0.9 volts.

Enable portion 330 includes P-channel transistors 332 and 334 and an N-channel transistor 336. Transistor 332 has a source connected to the power supply voltage terminal, a gate for receiving clock input signal CLK, and a drain connected to a node labeled "SBAR". Transistor 334 has a source connected to the power supply voltage terminal, a gate for receiving clock input signal CLK, and a drain connected to a node labeled "RBAR". Transistor 336 has a drain connected to the sources of transistors 312, 314, 316, and 318, a gate for receiving clock input signal CLK, and a source connected to ground.

Latch portion 340 includes a P-channel transistor 342, an N-channel transistor 344, a P-channel transistor 346, and an N-channel transistor 348. Transistor 342 has a source connected to the power supply voltage terminal, a gate connected to the RBAR node, and a drain connected to the SBAR node. Transistor 344 has a drain connected to the drain of transistor 342, a gate connected to the RBAR node, and a source connected to the drains of transistors 311 and 313. Transistor 346 has a source connected to the power supply voltage terminal, a gate connected to the SBAR node, and a drain connected to the RBAR node. Transistor 348 has a drain connected to the drain of transistor 346, a gate connected to the SBAR node, and a source connected to the drains of transistors 315 and 317.

Output circuit 350 includes NAND gates 352 and 354 and inverters 356 and 358. NAND gate 352 has a first input connected to the RBAR node, a second input, and an output. NAND gate 354 has a first input connected to the output of NAND gate 352, a second input connected to the SBAR node, and an output connected to the second input of NAND gate 352. Inverter 356 has an input connected to the output of NAND gate 352, and an output for providing an output signal labeled "Q". Inverter 358 has an input connected to the output of NAND gate 354, and an output for providing a complementary output signal labeled "QBAR".

In operation, when clock input signal CLK is low, transistors 332 and 334 precharge signals SBAR and RBAR high, respectively, and transistor 336 is non-conductive. On the rising edge of clock input signal CLK, either SBAR or RBAR discharges to ground depending on the states of data input signal D, scan data input signal SDI, and scan shift enable signal SSE. In the functional operation mode, scan shift enable signal SSE is low, and data input portion 310 selects data input signal D to determine the state of output signals Q and QBAR. Transistors 314 and 318 are non-conductive, and transistors 312 and 316 are conductive. If data input signal D is high, then transistor 311 is conductive and pulls the source of transistor 344 low when clock input signal CLK is high, while transistor 315 is non-conductive. If data input signal D is low, then transistor 311 is non-conductive and transistor 315 is conductive and pulls the source of transistor 348 low when clock input signal CLK is high. Alternatively, in the scan mode, scan shift enable signal SSE is high, and data input portion 310 selects the scan data input signal SDI to determine the state of output signals Q and QBAR. Transistors 312 and 316 are non-conductive, and transistors 314 and 318 are conductive. If scan data input signal SDI is high, then transistor 313 is conductive and pulls the source of transistor 344 low when clock input signal CLK is high, while transistor 317 is non-conductive. If data input signal D is low, then transistor 313 is non-conductive and transistor 317 is conductive and pulls the source of transistor 348 low when clock input signal CLK is high. Transistor 326 is a small device that provides a path to ground if the selected data input changes after clock signal CLK transitions high.

When clock input signal CLK transitions high, transistor 336 becomes conductive and transistors 332 and 334 become non-conductive. Latch portion 340 becomes operational to drive RBAR high and SBAR low in response to the selected data input signal, either D or SDI, being high, or to drive SBAR high and RBAR low in response to the selected data input signal, either D or SDI, being low.

Output circuit 350 forms an asynchronous SR flip-flop, with the second input of NAND gate 354 being connected to node SBAR and forming an active-low set input, and the first input of NAND gate 352 being connected to node RBAR and forming an active-low reset input.

Figure 4:
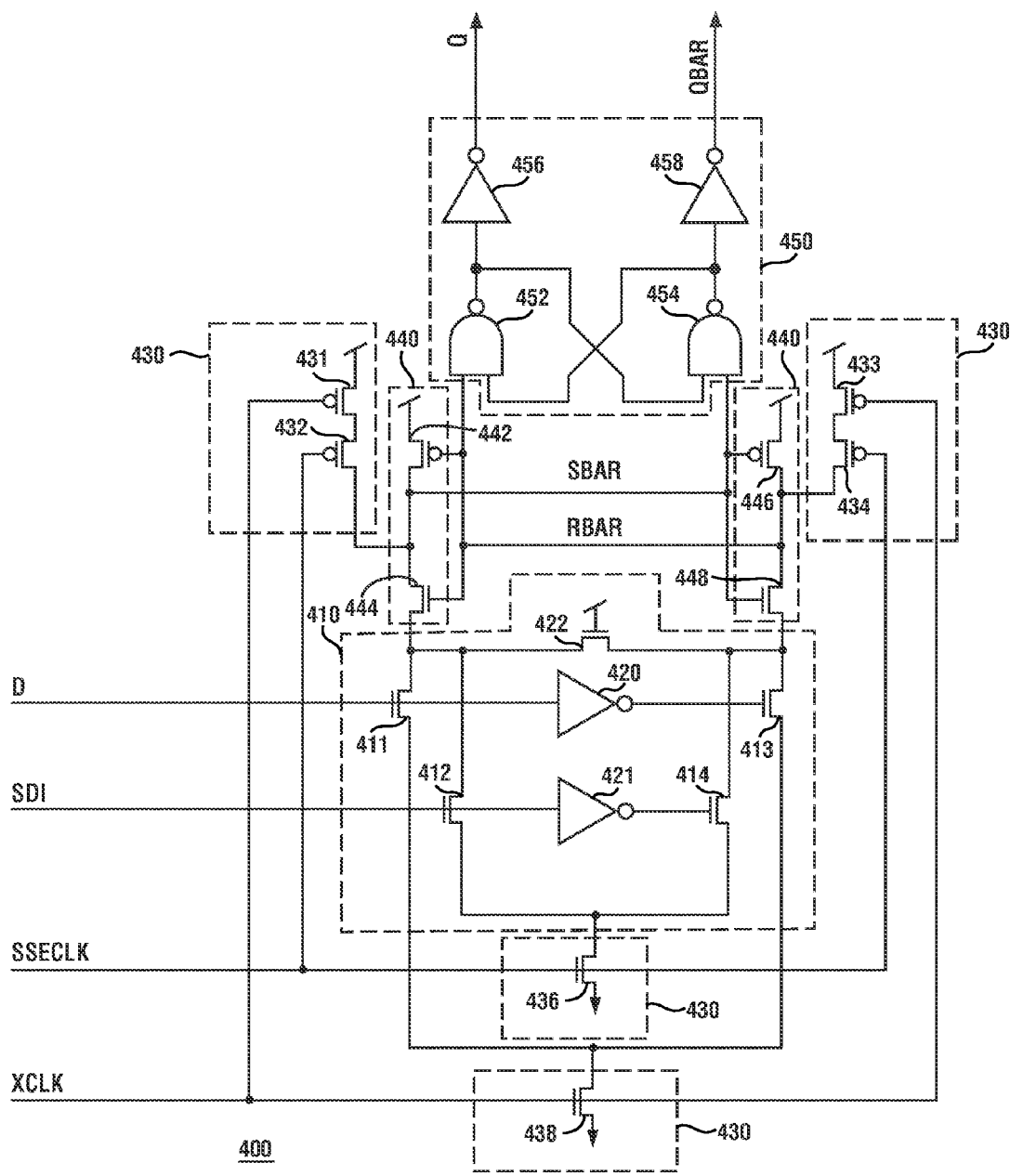
FIG. 4 illustrates in partial logic diagram and partial schematic form a dedicated clock flip-flop of the first type according to some embodiments.

FIG. 4 illustrates in partial logic diagram and partial schematic form a dedicated clock flip-flop 400 of the first type according to some embodiments. Dedicated clock flip-flop 400 is a DCFF that can be used as dedicated clock flip-flop 220 of FIG. 2 and generally includes a data input portion 410, an enable portion 430, a latch portion 440, and an output circuit 450.

Data input portion 410 includes N-channel MOS transistors 411-414, inverters 420 and 421, and an N-channel MOS transistor 422. Transistor 411 has a drain, a gate for receiving data input signal D, and a source. Transistor 412 has a drain connected to the drain of transistor 411, a gate for receiving scan data input signal SDI, and a source. Transistor 413 has a drain, a gate, and a source connected to the source of transistor 411. Transistor 414 has a drain connected to the drain of transistor 413, a gate, and a source connected to the source of transistor 412. Inverter 420 has an input for receiving data input signal D, and an output connected to the gate of transistor 413. Inverter 421 has an input for receiving scan data input signal SDI, and an output connected to the gate of transistor 414. Transistor 422 has a first source/drain terminal connected to the drains of transistors 411 and 412, a gate connected to the power supply voltage terminal, and a second source/drain terminal connected to the drains of transistors 413 and 414.

Enable portion 430 includes P-channel transistors 431-434 and N-channel transistors 436 and 438. Transistor 431 has a source connected to the power supply voltage terminal, a gate for receiving data clock signal XCLK, and a drain. Transistor 432 has a source connected to the drain of transistor 431, a gate for receiving scan clock signal SSECLK, and a drain connected to node SBAR. Transistor 433 has a source connected to the power supply voltage terminal, a gate for receiving data clock signal XCLK, and a drain. Transistor 434 has a source connected to the drain of transistor 433, a gate for receiving scan clock signal SSECLK, and a drain connected to node RBAR. Transistor 436 has a drain connected to the sources of transistors 412 and 414, a gate for receiving scan clock signal SSECLK, and a source connected to ground. Transistor 438 has a drain connected to the sources of transistors 411 and 413, a gate for receiving data clock signal XCLK, and a source connected to ground.

Latch portion 440 includes a P-channel transistor 442, an N-channel transistor 444, a P-channel transistor 446, and an N-channel transistor 448. Transistor 442 has a source connected to the power supply voltage terminal, a gate connected to the RBAR node, and a drain connected to the SBAR node. Transistor 444 has a drain connected to the drain of transistor 442, a gate connected to the RBAR node, and a source connected to the drains of transistors 411 and 412 and to the first source/drain terminal of transistor 422. Transistor 446 has a source connected to the power supply voltage terminal, a gate connected to the SBAR node, and a drain connected to the RBAR node. Transistor 448 has a drain connected to the drain of transistor 446, a gate connected to the SBAR node, and a source connected to the drains of transistors 413 and 414.

Output circuit 450 includes NAND gates 452 and 454 and inverters 456 and 458. NAND gate 452 has a first input connected to the RBAR node, a second input, and an output. NAND gate 454 has a first input connected to the output of NAND gate 452, a second input connected to the SBAR node, and an output connected to the second input of NAND gate 452. Inverter 456 has an input connected to the output of NAND gate 452, and an output for providing output signal Q. Inverter 458 has an input connected to the output of NAND gate 454, and an output for providing complementary output signal QBAR.

In operation, when both data clock signal XCLK and scan clock signal SSECLK are inactive at a logic low, nodes SBAR and RBAR are precharged to a logic high level. On the rising edge of either XCLK or SSSECLK, transistor 438 or transistor 436 becomes conductive, respectively, and enable portion 430 stops providing the precharge voltage to nodes SBAR and RBAR. If data clock signal XCLK transitions to a logic high, transistor 438 becomes conductive, and a selected one of transistors 411 and 413 becomes conductive based on the logic state of data input signal D. For example, if data input signal D is high, then transistor 411 is conductive and transistor 413 is non-conductive. The gate of transistor 444 retains a logic high from the precharge and transistor 444 becomes conductive, pulling node SBAR low, which in turn makes transistor 446 conductive and pulls node RBAR high. Output circuit 450 quickly latches the difference in voltage between SBAR and RBAR to provide output signal Q at a logic high and output signal QBAR at a logic low. If data input signal D is low, then transistor 413 is conductive and transistor 411 is non-conductive. The gate of transistor 448 retains a logic high from the precharge and transistor 448 becomes conductive, pulling node RBAR low, which in turn makes transistor 442 conductive and pulls node SBAR high. Output circuit 450 quickly latches the difference in voltage between RBAR and SBAR to provide output signal Q at a logic low and output signal QBAR at a logic high. Transistor 442 keeps the voltages between the sources of transistors 444 and 448 close to each other to achieve fast switching.

Figure 5:
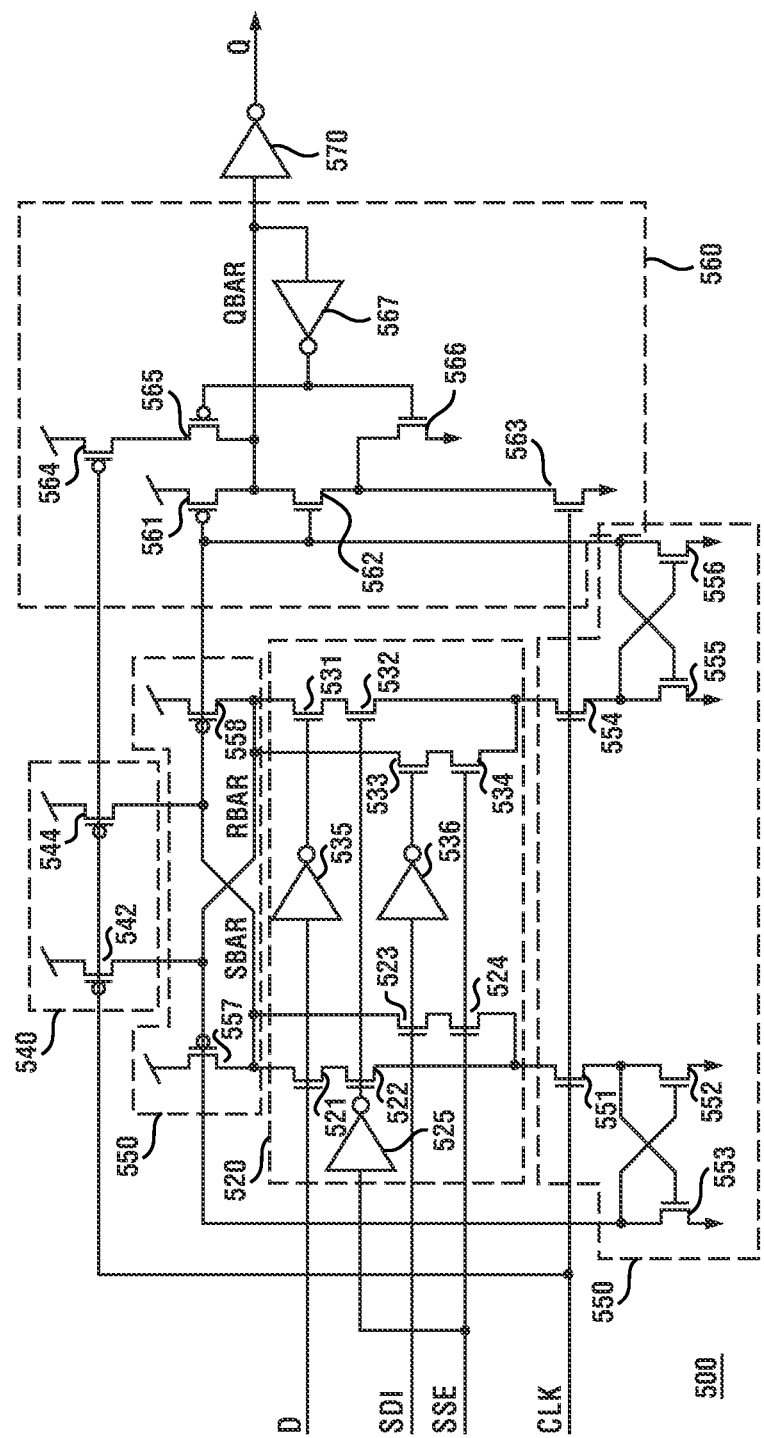
FIG. 5 illustrates in partial logic diagram and partial schematic form a dedicated clock flip-flop of a second type known in the prior art.

FIG. 5 illustrates in partial logic diagram and partial schematic form a flip-flop 500 of a second type known in the prior art. The second type is known as an asymmetric precharged flip-flop. Flip-flop 500 is an STDFF known as an asynchronous precharged flip-flop and includes generally a data input portion 520, a precharge portion 540, a latch portion 550, a latch circuit 560, and an output inverter 570.

Data input portion 520 includes N-channel transistors 521-524, an inverter 525, N-channel transistors 531-534, and inverters 535 and 536. Transistor 521 has a drain connected to node SBAR, a gate for receiving data input signal D, and a source. Transistor 522 has a drain connected to the source of transistor 521, a gate, and a source. Transistor 523 has a drain connected to node SBAR, a gate for receiving scan data input signal SDI, and a source. Transistor 524 has a drain connected to the source of transistor 523, a gate for receiving scan shift enable signal SSE, and a source connected to the source of transistor 522. Inverter 525 has an input for receiving scan shift enable signal SSE, and an output connected to the gate of transistor 522. Transistor 531 has a drain connected to node RBAR, a gate, and a source. Transistor 532 has a drain connected to the source of transistor 531, a gate connected to the output of inverter 525, and a source. Transistor 533 has a drain connected to node RBAR, a gate, and a source. Transistor 534 has a drain connected to the source of transistor 533, a gate for receiving scan shift enable signal SSE, and a source connected to the source of transistor 532. Inverter 535 has an input for receiving data input signal D, and an output connected to the gate of transistor 531. Inverter 536 has an input for receiving scan data input signal SDI, and an output connected to the gate of transistor 533.

Precharge portion 540 includes P-channel transistor 542 and 544. Transistor 542 has a source connected to the power supply voltage terminal, a gate for receiving clock input signal CLK, and a drain connected to node RBAR. Transistor 544 has a source connected to the power supply voltage terminal, a gate for receiving clock input signal CLK, and a drain connected to node SBAR.

Latch portion 550 includes N-channel transistors 551-556, and P-channel transistors 557 and 558. Transistor 551 has a drain connected to the sources of transistors 522 and 524, a gate for receiving clock input signal CLK, and a source. Transistor 552 has a drain connected to the source of transistor 551, a gate connected to node RBAR, and a source connected to ground. Transistor 553 has a drain connected to node RBAR, a gate connected to the drain of transistor 552, and a source connected to ground. Transistor 554 has a drain connected to the sources of transistors 532 and 534, a gate for receiving clock input signal CLK, and a source. Transistor 555 has a drain connected to the source of transistor 554, a gate connected to node SBAR, and a source connected to ground. Transistor 556 has a drain connected to node SBAR, a gate connected to the drain of transistor 555, and a source connected to ground. Transistor 557 has a source connected to the power supply voltage terminal, a gate connected to node RBAR, and a source connected to node SBAR. Transistor 558 has a source connected to the power supply voltage terminal, a gate connected to node SBAR, and a source connected to node RBAR.

Latch circuit 560 includes a P-channel transistor 561, N-channel transistors 562 and 563, P-channel transistors 564 and 565, an N-channel transistor 566, and an inverter 567. Transistor 561 has a source connected to the power supply voltage terminal, a gate connected to node SBAR, and a source connected to a node labeled "QBAR". Transistor 562 has a drain connected to the drain of transistor 561 at node QBAR, a gate connected to node SBAR, and a source. Transistor 563 has a drain connected to the source of transistor 562, a gate for receiving clock input signal CLK, and a source connected to ground. Transistor 564 has a source connected to the power supply voltage terminal, a gate for receiving the clock input signal CLK, and a drain. Transistor 565 has a source connected to the drain of transistor 564, a gate, and a source connected to node QBAR. Transistor 566 has a drain connected to the source of transistor 562, a gate, and a source connected to ground. Inverter 567 has an input connected to the QBAR node, and an output connected to the gates of transistors 565 and 566.

Inverter 570 has an input connected to node QBAR, and an output for providing output signal Q.

In operation, flip-flop 500 is a type of flip-flop known as an asymmetric precharged flip-flop (APFF) and includes a scan capability. When scan shift enable signal SSE is low, flip-flop 500 is in a functional operation mode and the logic state of output signal Q is determined by the logic state of data input signal D. The low voltage on scan shift enable signal SSE causes the output of inverter 525 to go high, which makes transistors 522 and 532 conductive and causes the state of data input signal D to determine the logic state of output signal Q. In the functional operation mode, when clock signal CLK is low, transistors 542 and 544 are conductive and precharge nodes RBAR and SBAR high, respectively. If data input signal D is high, then as clock signal CLK rises, SBAR falls, which holds RBAR high by making transistor 558 conductive. Latch portion 550 amplifies and latches the differential voltage between RBAR and SBAR, resulting in a stable logic low voltage on signal SBAR. The logic low voltage on SBAR in turn causes latch circuit 560 and output inverter 570 to drive output signal Q low. If on the other hand data input signal D is low, then as true clock signal CLK rises, RBAR falls, which holds SBAR high by making transistor 557 conductive. Latch portion 550 amplifies and latches the differential voltage between SBAR and RBAR, resulting in a stable logic high voltage on SBAR. The logic high voltage on SBAR in turn causes latch circuit 560 and output inverter 570 to drive output signal Q high.

When scan shift enable signal SSE is high, flip-flop 500 is in a scan mode and the logic state of output signal Q is determined by the logic state of scan data input signal SDI. In the scan mode, when clock signal CLK is low, transistors 442 and 444 are conductive and precharge nodes RBAR and SBAR high, respectively. If scan data input signal SDI is high, then as true clock signal CLK rises, SBAR falls, which causes RBAR to rise. Latch portion 550 amplifies and latches the differential voltage between RBAR and SBAR, resulting in a stable logic low voltage on signal SBAR. The logic low voltage on SBAR in turn causes latch circuit 560 and output inverter 570 to drive output signal Q low. If on the other hand scan data input signal SDI is low, then as clock signal CLK rises, RBAR falls, which causes SBAR to rise. Latch portion 550 amplifies and latches the differential voltage between SBAR and RBAR, resulting in a stable logic high voltage on signal SBAR. The logic high voltage on SBAR in turn causes latch circuit 560 and output inverter 570 to drive output signal Q high.

In this manner, scan enable signal SSE selects the scan mode of operation and a corresponding input signal, and the rising edge of clock signal CLK causes latch portion 550 to quickly latch a differential voltage between SBAR and RBAR. Moreover latch circuit 560 includes its own latching mechanism using inverter 567 to reinforce the logic state developed on QBAR. Latch circuit 560 is blocking when clock signal CLK is low, and transparent when clock signal CLK is high.

However when clock signal CLK is low, transistors 552 and 553 are discharged low. When clock signal CLK rises and the selected data input signal is high, then the delay through data input portion 520 and latch portion 550 of flip-flop 500 requires three nominal gate delays as node SBAR is discharged from a precharged high state through transistors 521, 522, 551, and 552. Only when the logic high voltage on SBAR is suitably discharged does transistor 558 become conductive enough to charge QBAR high, which in turn will discharge output signal Q low. On the other hand when clock signal CLK rises and the selected data signal is low, then the delay through data input portion 520 and latch portion 550 of flip-flop 500 requires two nominal gate delays as node SBAR is discharged from a precharged high state through transistors 521, 522, 551, and 552. Only when the logic high voltage on SBAR is suitably discharged does transistor 558 become conductive to reinforce the logic high on RBAR.

Since the delay may be as many as three nominal gate delays, the frequency of the clock signal driving the circuits in which flip-flop 500 is used is limited by the setup time of data input signal D (or scan data input signal SDI) before the rising edge of true clock signal CLK plus three nominal gate delays.

Figure 6:
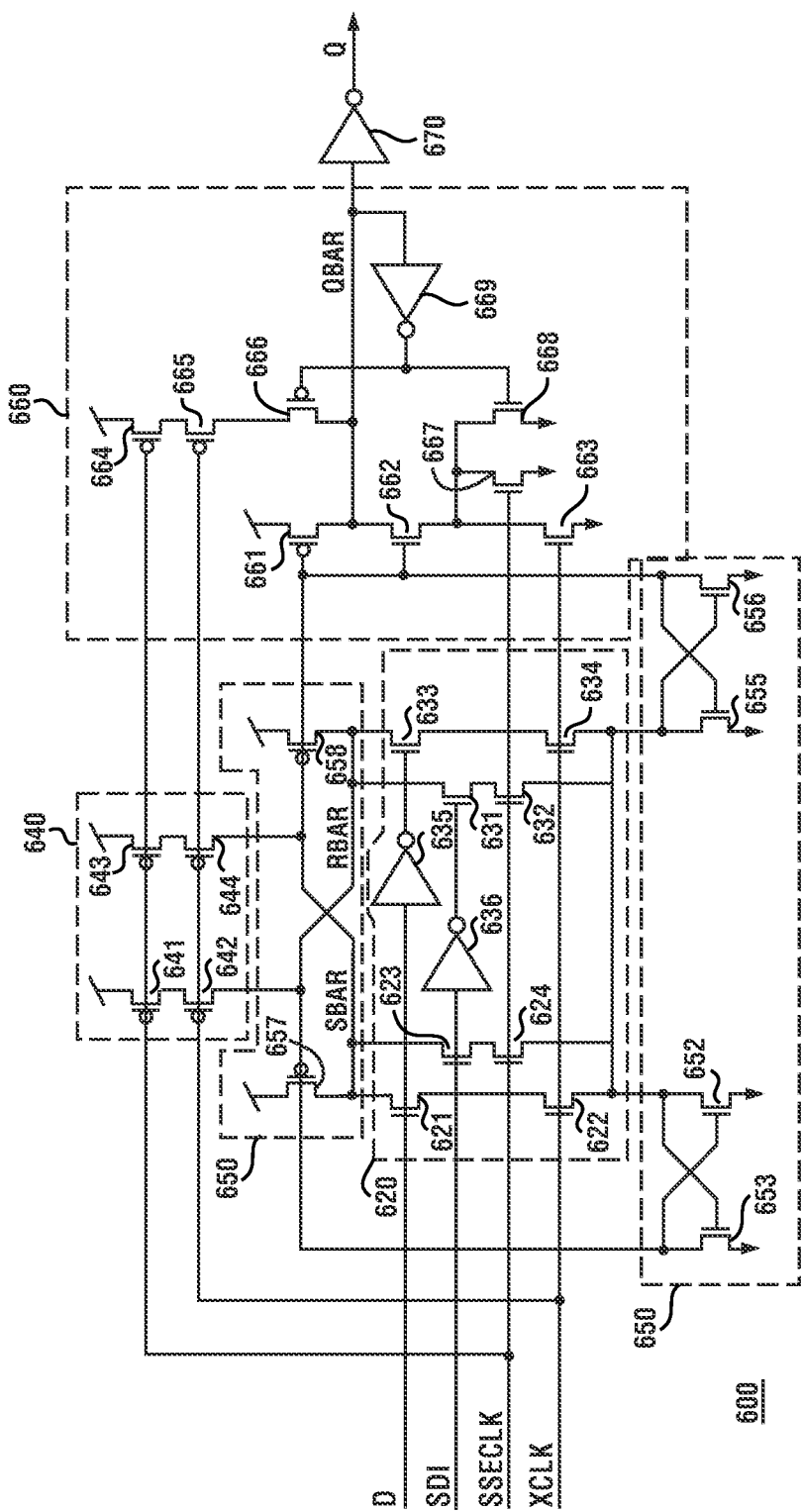
FIG. 6 illustrates in partial logic diagram and partial schematic form a dedicated clock flip-flop of the second type according to some embodiments.

FIG. 6 illustrates in partial logic diagram and partial schematic form a dedicated clock flip-flop 600 of the second type according to some embodiments. Dedicated clock flip-flop 600 is a DCFF that can be used as dedicated clock flip-flop 220 of FIG. 2 and includes generally a data input portion 620, a precharge portion 640, a latch portion 650, a latch circuit 660, and an inverter 670.

Data input portion 620 includes N-channel transistors 621-624 and 631-634, and inverters 635 and 636. Transistor 621 has a drain connected to node SBAR, a gate for receiving data input signal D, and a source. Transistor 622 has a drain connected to the source of transistor 621, a gate for receiving data clock signal XCLK, and a source. Transistor 623 has a drain connected to node SBAR, a gate for receiving scan data input signal SDI, and a source. Transistor 624 has a drain connected to the source of transistor 623, a gate for receiving scan clock signal SSECLK, and a source connected to the source of transistor 622. Transistor 631 has a drain connected to node RBAR, a gate, and a source. Transistor 632 has a drain connected to the source of transistor 631, a gate for receiving scan clock signal SSECLK, and a source. Transistor 633 has a drain connected to node RBAR, a gate, and a source. Transistor 634 has a drain connected to the source of transistor 633, a gate for receiving data clock signal XCLK, and a source connected to the source of transistor 632. Inverter 635 has an input for receiving data input signal D, and an output connected to the gate of transistor 633. Inverter 636 has an input for receiving scan data input signal SDI, and an output connected to the gate of transistor 631.

Precharge portion 640 includes P-channel transistor 641-644. Transistor 641 has a source connected to the power supply voltage terminal, a gate for receiving scan clock signal SSECLK, and a drain. Transistor 642 has a source connected to the drain of transistor 641, a gate for receiving data clock signal XCLK, and a source connected to node RBAR. Transistor 643 has a source connected to the power supply voltage terminal, a gate for receiving scan clock signal SSECLK, and a drain. Transistor 644 has a source connected to the drain of transistor 643, a gate for receiving data clock signal XCLK, and a source connected to node SBAR.

Latch portion 650 includes N-channel transistors 652, 653, 655, and 656, and P-channel transistors 657 and 658. Transistor 651 has a drain connected to the sources of transistors 622 and 624, a gate connected to node RBAR, and a source connected to ground. Transistor 653 has a drain connected to node RBAR, a gate connected to the drain of transistor 652, and a source connected to ground. Transistor 655 has a drain connected to the sources of transistors 632 and 634, a gate connected to node SBAR, and a source connected to ground. Transistor 656 has a drain connected to node SBAR, a gate connected to the drain of transistor 655, and a source connected to ground. Transistor 657 has a source connected to the power supply voltage terminal, a gate connected to node RBAR, and a source connected to node SBAR. Transistor 658 has a source connected to the power supply voltage terminal, a gate connected to node SBAR, and a source connected to node RBAR.

Latch circuit 660 includes a P-channel transistor 661, N-channel transistors 662 and 663, P-channel transistors 664-666, N-channel transistors 667 and 668, and an inverter 669. Transistor 661 has a source connected to the power supply voltage terminal, a gate connected to node SBAR, and a source connected to node QBAR. Transistor 662 has a drain connected to the drain of transistor 661 at node QBAR, a gate connected to node SBAR, and a source. Transistor 663 has a drain connected to the source of transistor 662, a gate for receiving data clock signal XCLK, and a source connected to ground. Transistor 664 has a source connected to the power supply voltage terminal, a gate for receiving scan clock signal SSECLK, and a drain. Transistor 665 has a source connected to the drain of transistor 664, a gate for receiving data clock signal XCLK, and a source. Transistor 666 has a source connected to the drain of transistor 665, a gate, and a drain connected to node QBAR. Transistor 667 has a drain connected to the source of transistor 662, a gate for receiving scan clock signal SSECLK, and a source connected to ground. Transistor 668 has a drain connected to the source of transistor 662, a gate, and a source connected to ground. Inverter 669 has an input connected to the QBAR node, and an output connected to the gates of transistors 666 and 668.

Inverter 670 has an input connected to node QBAR, and an output for providing output signal Q.

In operation, flip-flop 600 is also an asymmetric precharged flip-flop (APFF) and includes scan capability. When both scan clock signal SSECLK and data clock signal XCLK are low, transistors 641 and 642 precharge node RBAR high, and transistors 643 and 644 precharge node SBAR high. These nodes are selectively discharged by data input portion 620 based on the mode. In functional operation mode, scan clock signal SSECLK remains low and low-to-high transitions of data clock signal XCLK input data to selectively discharge one of nodes SBAR and RBAR based on the state of data input signal D and to hold the opposite node high. In scan mode, data clock signal XCLK remains low and low-to-high transitions of scan clock signal SSECLK input scan data to selectively discharge one of nodes SBAR and RBAR based on the state of scan data input signal SDI and to hold the opposite node high. Note that data input portion 620 has only two transistors in series to discharge the selected node (SBAR or RBAR) to ground. For example in functional operation mode when data signal D is high, transistors 621, 622, and 652 discharge node SBAR to ground. Thus the DCFF implementation of an asymmetric precharged flip-flop (flip-flop 600) requires lower setup time and allows for faster clock operation than the comparable STDFF implementation of an asymmetric precharged flip-flop (flip-flop 500).

Figure 7:
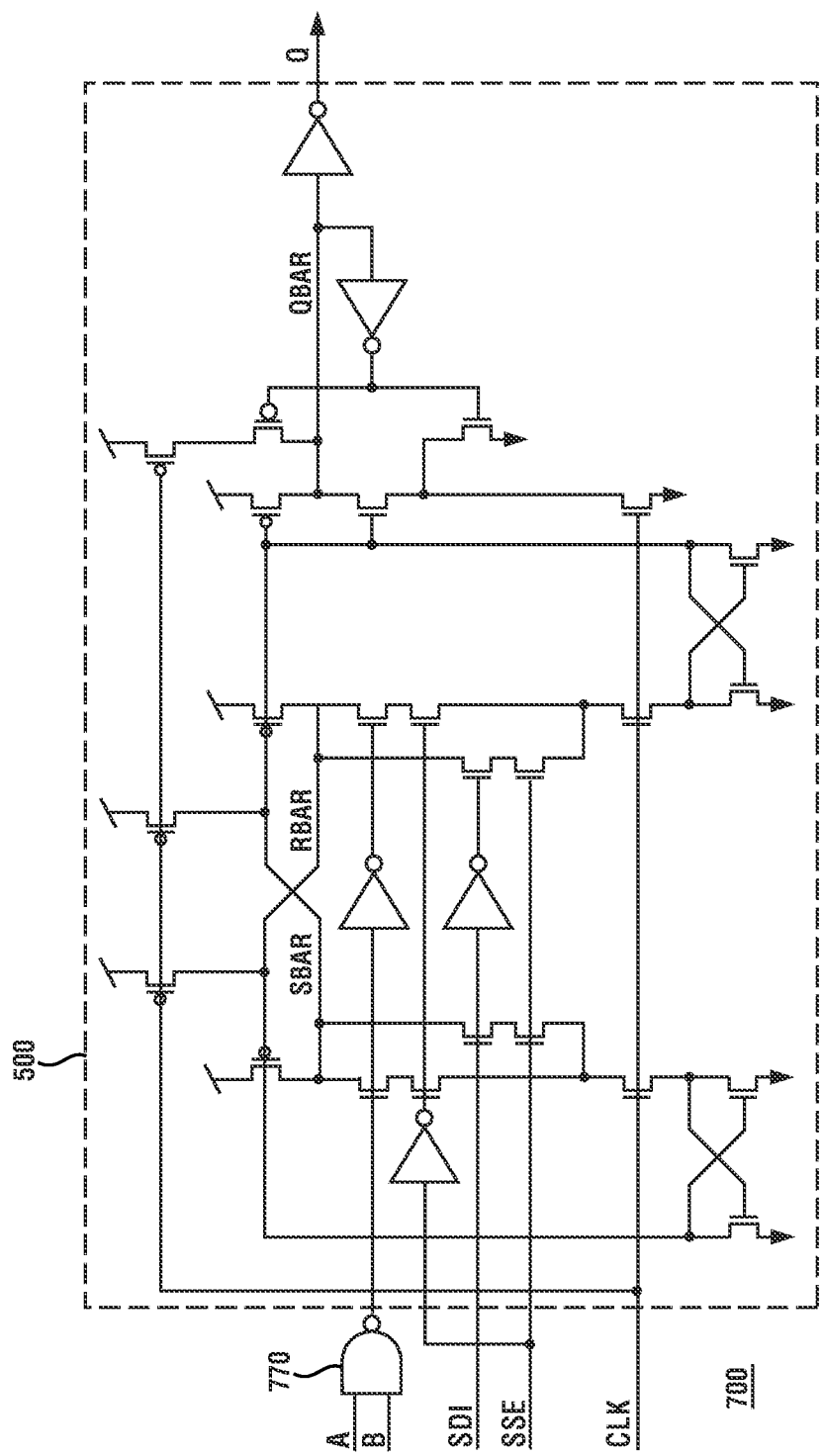
FIG. 7 illustrates in partial logic diagram and partial schematic form a dedicated clock flip-flop of the second type with an integral logic function known in the prior art.

FIG. 7 illustrates in partial logic diagram and partial schematic form a flip-flop core 700 of the second type with an integral logic function known in the prior art. Flip-flop core 700 is a known asynchronous precharged flip-flop and generally includes flip-flop 500 as previously illustrated in FIG. 5 and a NAND gate 770. NAND gate 770 has a first input for receiving a data input signal labeled "A", a second input for receiving a data input signal labeled "B", and an output that forms the data input signal to flip-flop 500.

Figure 8:
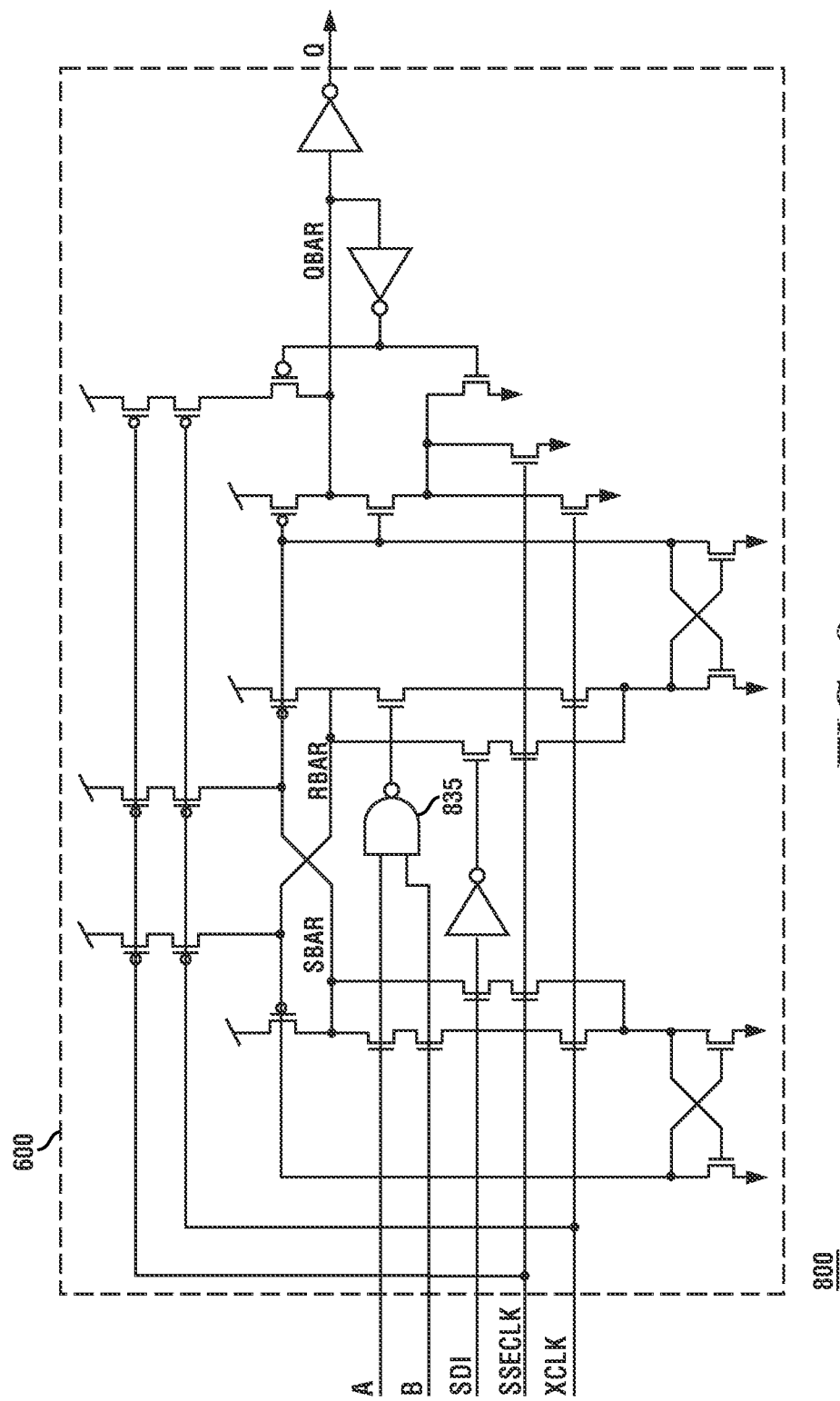
FIG. 8 illustrates in partial logic diagram and partial schematic form a dedicated clock flip-flop of the second type with the integral logic function according to some embodiments.

FIG. 8 illustrates in partial logic diagram and partial schematic form a dedicated clock flip-flop 800 of the second type with the integral logic function according to some embodiments. Dedicated clock flip-flop 800 is a DCFF and generally includes dedicated clock flip-flop 600 substantially as illustrated in FIG. 6 except that dedicated clock flip-flop 800 includes an extra N-channel transistor 826 and a NAND gate 835 in place of inverter 635. As modified, the gate of transistor 621 receives data input signal A, and the source of transistor 621 is connected to the drain of transistor 622 through an additional N-channel transistor 826 having a drain connected to the source of transistor 621, a gate for receiving data input signal B, and a source connected to the drain of transistor 622. NAND gate 835 has a first input for receiving data input signal A, a second input for receiving data input signal B, and an output connected to the gate of transistor 633.

Figure 9:
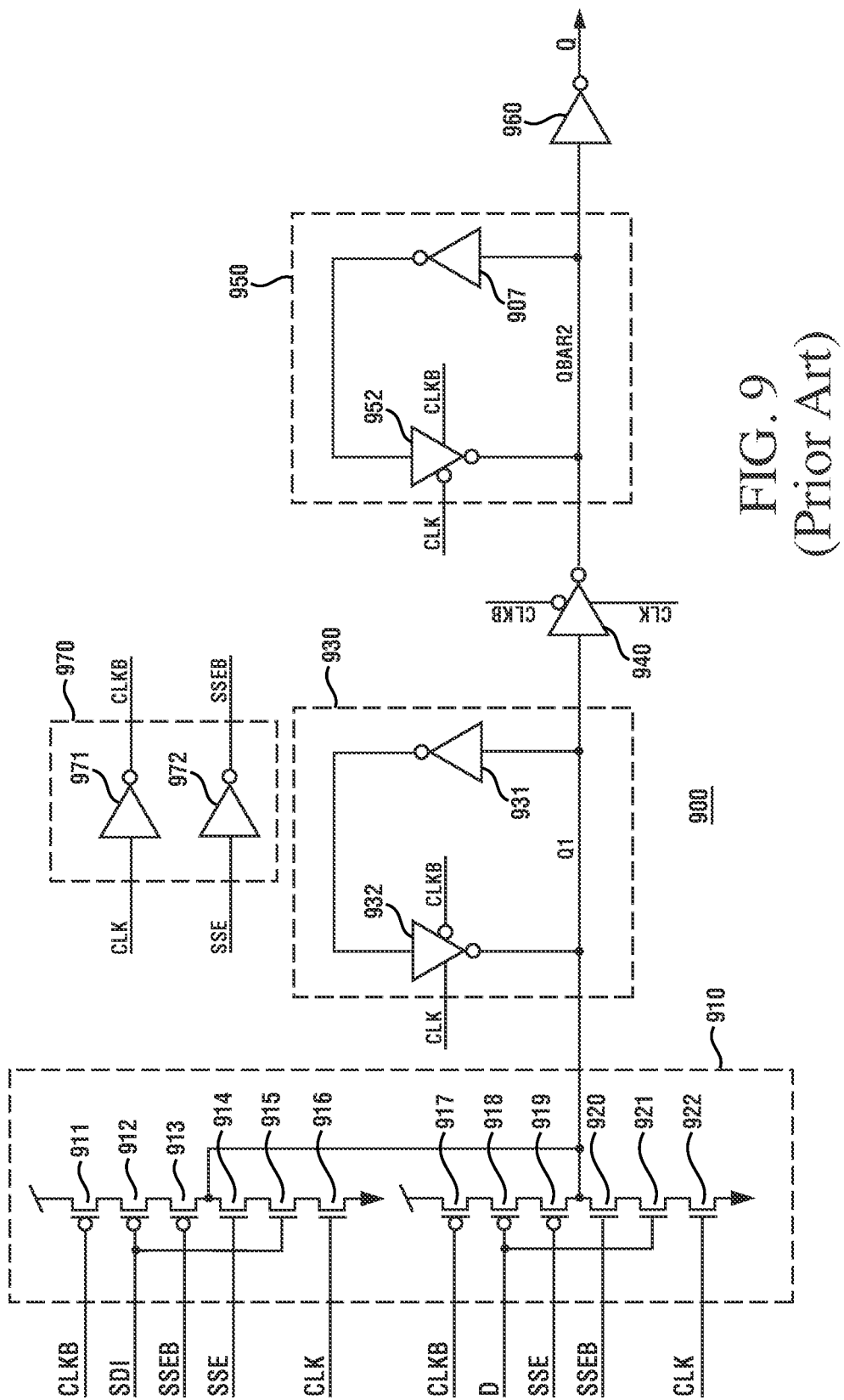
FIG. 9 illustrates in partial logic diagram and partial schematic form a dedicated clock flip-flop of a third type known in the prior art.

FIG. 9 illustrates in partial logic diagram and partial schematic form a flip-flop 900 of a third type known in the prior art. The third type is known as a master-slave flip-flop. Flip-flop 900 is an STDFF known as a master-slave flip-flop and generally includes an input multiplexer 910, a master latch 930, a clocked gate 940, a slave latch 950, an output inverter 960, and a local clock driver 970.

Input multiplexer 910 includes P-channel transistors 911-913, N-channel transistors 914-916, P-channel transistors 917-919, and N-channel transistors 920-922. Transistor 911 has a source connected to the power supply voltage terminal, a gate for receiving a complementary clock signal labeled "CLKB", and a drain. Transistor 912 has a source connected to the drain of transistor 911, a gate for receiving scan data input signal SDI, and a drain. Transistor 913 has a source connected to the drain of transistor 912, a gate for receiving a complement of the scan shift enable signal labeled "SSEB", and a drain connected to a node labeled "Q1". Transistor 914 has a drain connected to the drain of transistor 913 at node Q1, a gate for receiving scan shift enable signal SSE, and a source. Transistor 915 has a drain connected to the source of transistor 914, a gate for receiving scan data input signal SDI, and a source. Transistor 916 has a drain connected to the source of transistor 915, a gate for receiving clock input signal CLK, and a source connected to ground. Transistor 917 has a source connected to the power supply voltage terminal, a gate for receiving a complementary clock input signal labeled "CLKB", and a drain. Transistor 918 has a source connected to the drain of transistor 917, a gate for receiving data input signal D, and a drain. Transistor 919 has a source connected to the drain of transistor 912, a gate for receiving scan shift enable signal SSE, and a drain connected to node Q1. Transistor 920 has a drain connected to the drain of transistor 919 at node Q1, a gate for receiving complementary scan shift enable signal SSEB, and a source. Transistor 921 has a drain connected to the source of transistor 920, a gate for receiving data input signal D, and a source. Transistor 922 has a drain connected to the source of transistor 921, a gate for receiving clock input signal CLK, and a source connected to ground.

Master latch 930 includes inverters 931 and 932. Inverter 931 has an input connected to node Q1, and an output. Inverter 932 is a three-state inverter having an input connected to the output of inverter 931, an output connected to node Q1, a true control input for receiving clock input signal CLK, and a complementary control input for receiving complementary clock input signal CLKB.

Clocked gate 940 is a three-state inverter having an input connected to node Q1, an output connected to a node labeled "QBAR2", a true control input for receiving clock input signal CLK, and a complementary control input for receiving complementary clock input signal CLKB.

Slave latch 950 includes inverters 951 and 952. Inverter 951 has an input connected to node QBAR2, and an output. Inverter 952 is a three-state inverter having an input connected to the output of inverter 951, an output connected to node QBAR2, a true control input for receiving complementary clock signal CLKB, and a complementary control input for receiving clock input signal CLK.

Output inverter 960 has an input connected to node QBAR2, and an output for providing output signal Q.

Local clock driver 970 includes inverters 971 and 972. Inverter 971 has an input for receiving clock input signal CLK, and an output for providing complementary clock input signal CLKB. Inverter 972 has an input for receiving scan shift enable signal SSE, and an output for providing complementary scan shift enable signal SSEB.

In operation, input multiplexer 910 is operational to input either data input signal D or scan data input signal SDI onto node Q1. In functional operation mode when scan mode signal SSE is low and complementary scan mode signal SSEB is high, the logic gate formed by transistors 911-915 is disabled. Transistors 919 and 920 are both conductive, the state of node Q1 is determined by the logic state of data input signal D, and transistors 917, 918, 921, and 922 operate as a clocked inverter. If data input signal D is low, then input multiplexer 910 provides a logic high on node Q1, whereas if data input signal D is high, then input multiplexer 910 provides a logic low on node Q1.

In scan mode when scan mode signal SSE is high and complementary scan mode signal SSEB is low, and the logic gate formed by transistors 917-922 is disabled. Transistors 913 and 914 are both conductive, the state of node Q1 is determined by the logic state of scan data input signal SDI, and transistors 911, 912, 915, and 916 operate as a clocked inverter. If scan data input signal SDI is low, then input multiplexer 910 provides a logic high on node Q1, whereas if scan data input signal SDI is high, then input multiplexer 910 provides a logic low on node Q1.

When clock input signal CLK is high and complementary clock input signal CLKB is low, inverter 932 is active and master latch 930 latches the logic state of node Q1. At this time clocked gate 940 is also active, and inverts the voltage on node Q1 to provide signal QBAR2. Output inverter 960 provides signal Q is the complement of signal QBAR2.

Input multiplexer 910 includes two logic gates that are each implemented using a stack of three P-channel transistors between the power supply terminal and the output node and three N-channel transistors between the output node and ground. The gate delays of these transistors contributes to input setup time.

Figure 10:
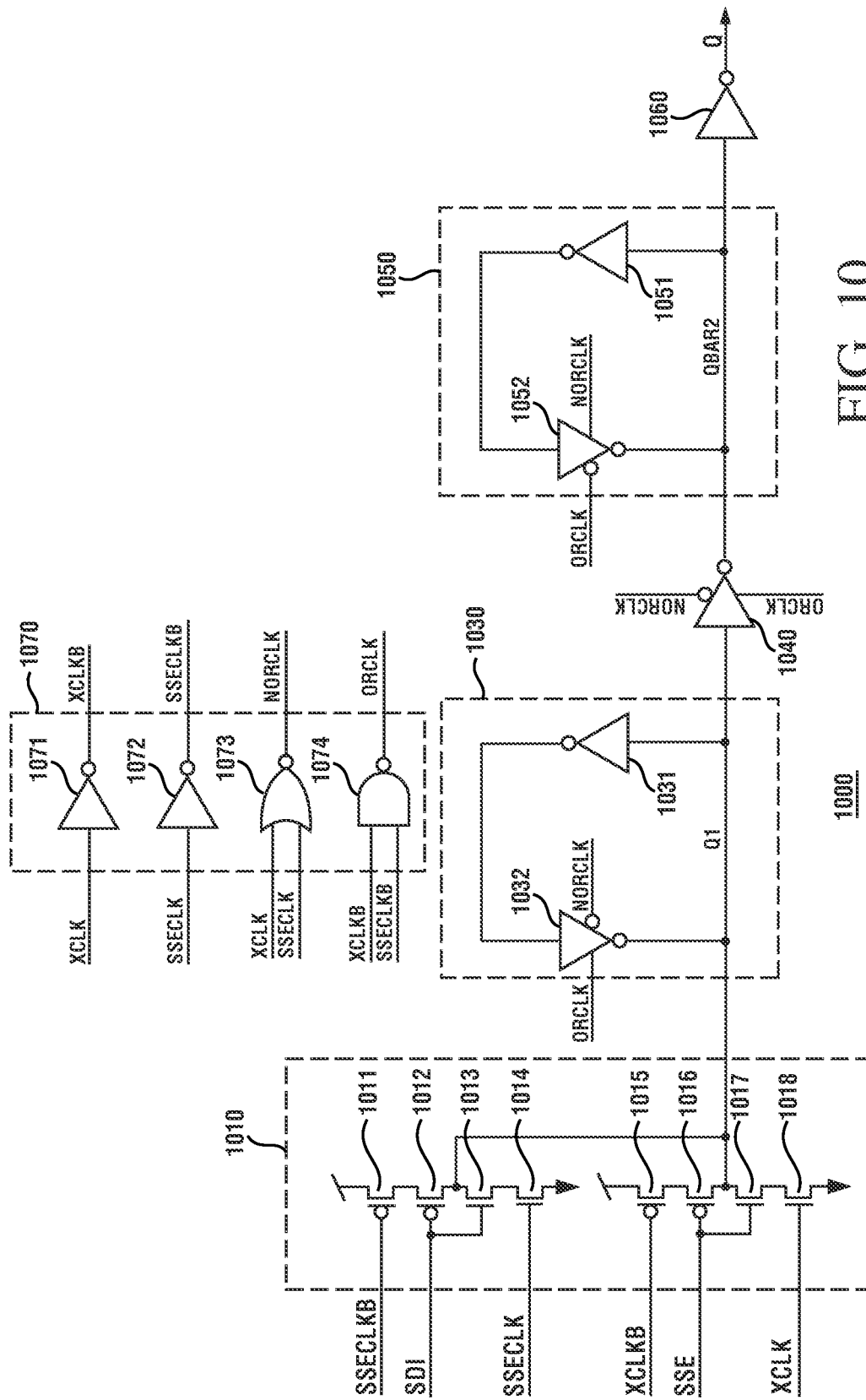
FIG. 10 illustrates in partial logic diagram and partial schematic form a dedicated clock flip-flop of the third type according to some embodiments.

FIG. 10 illustrates in partial logic diagram and partial schematic form a dedicated clock flip-flop 1000 of the third type according to some embodiments. Dedicated clock flip-flop 1000 is a DCFF that can be used as dedicated clock flip-flop 220 of FIG. 2 and includes an input multiplexer 1010, a master latch 1030, a clocked gate 1040, a slave latch 1050, an output inverter 1060, and a local clock gating cell 1070.

Input multiplexer 1010 includes P-channel transistors 1011 and 1012, N-channel transistors 1013 and 1014, P-channel transistors 1015 and 1016, and N-channel transistors 1017 and 1018. Transistor 1011 has a source connected to the power supply voltage terminal, a gate for receiving a complementary scan clock signal labeled "SSECLKB", and a drain. Transistor 1012 has a source connected to the drain of transistor 1011, a gate for receiving scan data input signal SDI, and a drain connected to node Q1. Transistor 1013 has a drain connected to the drain of transistor 1012 at node Q1, a gate for receiving scan data input signal SDI, and a source. Transistor 1014 has a drain connected to the source of transistor 1013, a gate for receiving scan clock signal SSECLK, and a source connected to ground. Transistor 1015 has a source connected to the power supply voltage terminal, a gate for receiving data clock signal XCLK, and a drain. Transistor 1016 has a source connected to the drain of transistor 1015, a gate for receiving scan shift enable signal SSE, and a drain connected to node Q1. Transistor 1017 has a drain connected to the drain of transistor 1016 at node Q1, a gate for receiving scan shift enable signal SSE, and a source. Transistor 1018 has a drain connected to the source of transistor 1017, a gate for receiving data clock signal XCLK, and a source connected to ground.

Master latch 1030 includes inverters 1031 and 1032. Inverter 1031 has an input connected to node Q1, and an output. Inverter 1032 is a three-state inverter having an input connected to the output of inverter 1031, an output connected to node Q1, a true control input for receiving a clock signal labeled "ORCLK", and a complementary control input for receiving a clock signal labeled "NORCLK".

Clocked gate 1040 is a three-state inverter having an input connected to node Q1, an output connected to node QBAR2, a true control input for receiving clock signal ORCLK, and a complementary control input for receiving clock signal NORCLK.

Slave latch 1050 includes inverters 1051 and 1052. Inverter 1051 has an input connected to node QBAR2, and an output. Inverter 1052 is a three-state inverter having an input connected to the output of inverter 1051, an output connected to node QBAR2, a true control input for receiving clock signal NORCLK, and a complementary control input for receiving clock signal ORCLK.

Output inverter 1060 has an input connected to node QBAR2, and an output for providing output signal Q.

Local clock gating cell 1070 includes inverters 1071 and 1072, a NOR gate 1073, and a NAND gate 1074. Inverter 1071 has an input for receiving data clock signal XCLK, and an output for providing complementary data clock signal XCLKB. Inverter 1072 has an input for receiving scan clock signal SSECLK, and an output for providing complementary scan clock signal SSECLKB. NOR gate 1073 has a first input for receiving data clock signal XCLK, a second input for receiving scan clock signal SSECLK, and an output for providing clock signal NORCLK. NAND gate 1074 has a first input for receiving complementary data clock signal XCLKB, a second input for receiving complementary scan clock signal SSECLKB, and an output for providing clock signal ORCLK.

In operation, input multiplexer 1010 is operational to provide a logic signal on node Q1 in response to the complement of either data input signal D or scan data input signal SDI. In functional operation mode, scan clock signal SSECLK is driven continuously low and complementary scan clock signal SSECLKB is driven continuously high, and the logic gate formed by transistors 1011-1014 is disabled. During this time when data clock signal XCLK transitions from low to high and complementary data clock signal XCLKB transitions from high to low, the logic gate formed by transistors 1015-1018 functions as a clocked inverter and provides a complement of data input signal D on node Q1.

Conversely, in scan mode when data clock signal XCLK is driven continuously low and complementary data clock signal XCLKB is driven continuously low, the logic gate formed by transistors 1015-1018 is disabled. When scan clock signal SSECLK transitions from low to high and complementary data clock signal XCLKB transitions from high to low, the logic gate formed by transistors 1011-1014 functions as a clocked inverter and provides a complement of data input signal D on node Q1.

When clock signal ORCLK is high and complementary clock input signal NORCLK is low, inverter 1032 is active and master latch 1030 latches the logic state of node Q1. At this time clocked gate 1040 is also active, and inverts the voltage on node Q1 to provide signal QBAR2. Output inverter 1060 provides signal Q is the complement of signal QBAR2.

Flip-flop 1000 requires more circuit area than flip-flop 900 with the use of dedicated clock signals, but the stack height of transistors in multiplexer 1010 has been reduced to two from the stack height of three in input multiplexer 910 of flip-flop 900. Thus, flip-flop 1000 allows reduced setup time compared to flip-flop 900. In addition, the flow can be simplified in designs which use dedicated clocks for all flip-flops.

Figure 11:
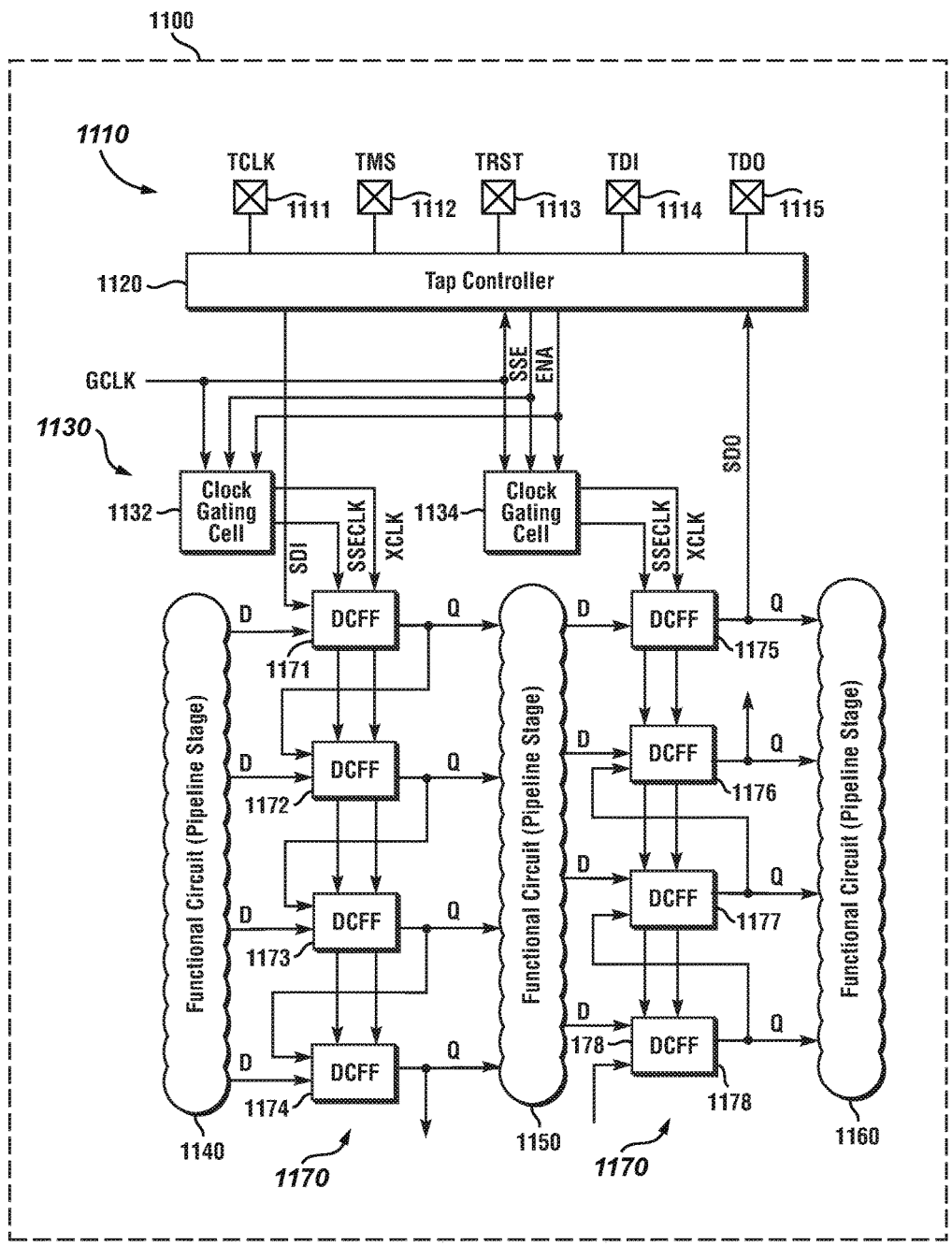
FIG. 11 illustrates in block diagram form a pipelined microprocessor with a scan chain using a scan flip-flop circuit with dedicated clocks according to some embodiments.

FIG. 11 illustrates in block diagram form a pipelined microprocessor 1100 with a scan chain 1170 using scan flip-flop circuits with dedicated clocks according to some embodiments. FIG. 11 shows features of pipelined microprocessor 1100 related to the use of DCFFs but does not show other features. These other features include conventional microprocessor features that are well-known to those of ordinary skill in the art. Pipelined microprocessor 1100 is a single chip data processor that can implement any of a number of known processor types such a reduced instruction set computer (RISC), a complex instruction set computer (CISC), a graphics processing unit (GPU), a digital signal processor (DSP), a network processor, and the like. Pipelined microprocessor 1100 includes generally a set of scan terminals 1110, a test access port (TAP) controller 1120, a set of clock gating cells 1130, functional circuits 1140, 1150, and 1160, and scan chain 1170.

Scan terminals 1110 are implemented as bonding pads used for communicating various signals related to the operation of TAP controller 1120. Scan terminals 1110 include an input terminal 1111 for receiving an external test clock signal labeled "TCLK", an input terminal 1112 for receiving a test mode select signal labeled "TMS", an input terminal 1113 for receiving an active low test reset signal labeled "nTRST", an input terminal 1114 for receiving test data input signal TDI, and an output terminal 1115 for providing a test data output signal labeled "TDO". In some embodiments such as that shown in FIG. 11, TAP controller 1120 can have an interface compatible with the Joint Test Action Group (JTAG) standard, IEEE 1149.1.

TAP controller 1120 has inputs or outputs connected to corresponding ones of scan terminals 1110, an input for receiving global clock signal GCLK, an output terminal for providing the scan shift enable signal SSE, and an output for providing the data enable signal ENA, and an output for providing scan data input signal SDI.

Clock gating cells 1130 include a clock gating cell 1132 and a clock gating cell 1134. Each of clock gating cells 1132 and 1134 has an input for receiving global clock signal GCLK, an input for receiving the scan shift enable signal SSE, an input for receiving the data enable signal ENA, an output for providing scan clock signal SSECLK, and an output for providing data clock signal XCLK.

Functional circuit 1140 has a set of inputs (not shown in FIG. 11), and a set of outputs for providing a set of data signals, all labeled generically as "D". Functional circuit 1150 has inputs for receiving respective data output signals, all labeled generically as "Q", and outputs for providing respective data output signals. Functional circuit 1160 has inputs for receiving respective data output signals Q, and a set of outputs (not shown in FIG. 11). In the illustrated embodiment, each of functional circuits 1140, 1150, and 1160 correspond to a pipeline stage in pipelined microprocessor 1100. For example, pipelined microprocessor 1100 can be a single scalar microprocessor and functional circuits 1140, 1150, and 1160 can function as decode, dispatch, and execute stages of the pipeline, respectively. In another example, pipelined microprocessor 1100 can be a super scalar microprocessor and functional circuits 1140, 1150, and 1160 can be pipeline stages of a functional unit such as a floating point unit (FPU) that is separate from other functional units.

Scan chain 1170 is formed with a set of DCFFs in which the data output signal Q of one DCFF is received at the scan data input SDI of a subsequent DCFF, and all DCFFs receive the scan clock signal SSECLK and data clock signal XCLK from one or more clock gating cells. As shown in FIG. 11, scan chain 1170 includes a first set of DCFFs including representative DCFFs 1171, 1172, 1173, and 1174 connected between functional circuit 1140 and functional circuit 1150, and with a scan path connected in series with one another as described above, as well as a second set of DCFFs including representative DCFFs 1175, 1176, 1177, and 1178 connected between functional circuit 1150 and functional circuit 1160, and with a scan path connected in series with one another as described above. The data output signal Q of DCFF 1175 forms signal SDO at the output of scan chain 1170. Each DCFF can be implemented with any one of the DCFFs illustrated in FIGS. 4, 6, 8, and 10 above.

As illustrated in FIG. 11, clock gating cell 1132 is common to DCFFs 1171-1174, and clock gating cell 1134 is common to DCFFs 1175-1178. The number of DCFFs driven by each clock gating cell will vary based on the particular sizes, layouts, separations, etc. of the particular pipelined microprocessor.

The circuits of FIGS. 2, 4, 6, 8, 10, and 11 or portions thereof may be described or represented by a computer accessible data structure in the form of a database or other data structure which can be read by a program and used, directly or indirectly, to fabricate integrated circuits with the circuits of FIGS. 2, 4, 6, 8, 10, and 11. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits with the circuits of FIGS. 2, 4, 6, 8, 10, and 11. The netlist may then be placed and routed to produce a data set describing geometric shapes to be applied to masks. The masks may then be used in various semiconductor fabrication steps to produce integrated circuits of FIGS. 2, 4, 6, 8, 10, and 11. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the implementation of an DCFF has been illustrated with reference to four particular types, but it may be implemented with other types not specifically described herein. These flip-flops can be to realize faster clock speeds in a variety of sequential logic circuits and in a variety of circuit locations, such as pipeline latches of microprocessors.

Accordingly, it is intended by the appended claims to cover all modifications of the disclosed embodiments that fall within the scope of the disclosed embodiments.

What is claimed is:

1. A scan flip-flop circuit comprising:
    a clock gating cell for providing an input clock signal as a scan clock signal when a scan enable signal is active, and for providing said input clock signal as a data clock signal when said scan enable signal is inactive; and
    a dedicated clock flip-flop for storing a data input signal and providing said data input signal, so stored, as a data output signal in response to transitions of said data clock signal, and for storing a scan data input signal and providing said scan data input signal, so stored, as said data output signal in response to transitions of said scan clock signal.

2. The scan flip-flop circuit of claim 1 wherein:
    said clock gating cell further provides said input clock signal as said data clock signal when both said scan enable signal is inactive and a data enable signal is active.

3. The scan flip-flop circuit of claim 2 wherein said clock gating cell comprises:
    a first AND gate having a first input for receiving said scan enable signal, a second input for receiving said input clock signal, and an output for providing said scan clock signal;
    a second AND gate having a first input for receiving said input clock signal, a second input, and an output for providing said data clock signal;
    a third AND gate having a first inverting input for receiving said scan enable signal, a second input for receiving said data enable signal, and an output; and
    a latch having a data input coupled to said output of said third AND gate, a clock input for receiving said input clock signal, and an output coupled to said second input of said second AND gate.

4. The scan flip-flop circuit of claim 1 wherein said dedicated clock flip-flop comprises a sense amplifier flip flop.

5. The scan flip-flop circuit of claim 1 wherein said dedicated clock flip-flop comprises an asymmetric precharged flip-flop.

6. The scan flip-flop circuit of claim 5 wherein said asymmetric precharged flip-flop includes an integral logic function.

7. The scan flip-flop circuit of claim 1 wherein said dedicated clock flip-flop comprises a master-slave flip-flop.

8. The scan flip-flop circuit of claim 7 wherein said master-slave flip-flop comprises:
    an input multiplexer for providing said scan data signal to a first node in response to an activation of said scan clock signal, and for providing said scan data signal to said first node in response to an activation of said data clock signal;
    a master latch coupled to said first node, for latching a voltage on said first node in response to a first latch clock signal;
    a clocked gate for transferring a logic state on said first node to a second node in response to a second latch clock signal;
    a slave latch coupled to said second node, for latching a voltage on said second in response to said second latch clock signal; and
    an output buffer having an input coupled to said second node, and an output for providing an output of said master-slave flip-flop.

9. The scan flip-flop circuit of claim 8 wherein said master-slave flip-flop further comprises:
    a local clock gating cell for providing said first latch clock in response to both said scan clock and said data clock being in a first logic state, and for providing said second latch clock in response to both said scan clock signal and said data clock signal being in a second logic state.

10. The scan flip-flop circuit of claim 8 wherein said input multiplexer comprises:
    a first transistor having a first current electrode coupled to a power supply voltage terminal, a control electrode for receiving a complement of said scan clock signal, and a second current electrode;
    a second transistor having a first current electrode coupled to said second current electrode of said first transistor, a control electrode for receiving said scan data signal, and a second current electrode coupled to said first node;
    a third transistor having a first current electrode coupled to said first node, a control electrode for receiving said scan data signal, and a second current electrode;

a fourth transistor having a first current electrode coupled to said second current electrode of said third transistor, a control electrode for receiving said scan clock signal, and a second current electrode coupled to a second power supply voltage terminal;

a fifth transistor having a first current electrode coupled to said power supply voltage terminal, a control electrode for receiving a complement of said data clock signal, and a second current electrode;

a sixth transistor having a first current electrode coupled to said second current electrode of said fifth transistor, a control electrode for receiving said data signal, and a second current electrode coupled to said first node;

a seventh transistor having a first current electrode coupled to said first node, a control electrode for receiving said data signal, and a second current electrode; and an eighth transistor having a first current electrode coupled to said second current electrode of said seventh transistor, a control electrode for receiving said data clock signal, and a second current electrode coupled to said second power supply voltage terminal.

11. A microprocessor comprising:

a first functional circuit having an output;

a second functional circuit having an input;

a scan chain disposed between said output of said first functional circuit and said input of said second functional circuit, wherein said scan chain captures said output of said first functional circuit and provides said output, so captured, to said input of said second functional circuit in a functional mode, and scans scan data into said scan chain and provides said scan data, so scanned, to said input of said second functional circuit in a scan mode, wherein said scan chain comprises:

a clock gating cell for providing an input clock signal as a scan clock signal when a scan enable signal is active, and for providing said input clock signal as a data clock signal when said scan enable signal is inactive; and a dedicated clock flip-flop for storing a data input signal and providing said data input signal, so stored, as a data output signal in response to transitions of said data clock signal, and for storing a scan data input signal and providing said scan data input signal, so stored, as said data output signal in response to transitions of said scan clock signal.

12. The microprocessor of claim 11, wherein the microprocessor is a pipelined microprocessor and said first and second functional circuits correspond to first and second pipeline stages of the microprocessor, respectively.

13. The microprocessor of claim 11, wherein said scan chain further comprises:

a plurality of flip-flops including said dedicated clock flip-flop and a plurality of additional dedicated clock flip-flops coupled in series.

14. The microprocessor of claim 13, further comprising:

a test access port controller for providing said scan data input signal said dedicated clock flip-flop during said scan mode.

15. The microprocessor of claim 13, further comprising:

a second clock gating cell coupled to at least some of said plurality of additional dedicated clock flip-flops.

16. A method comprising:

receiving an input clock signal and a scan enable signal;

generating a scan clock signal from said input clock signal when said scan enable signal is active;

generating a data clock signal from said input clock signal when said scan enable signal is inactive;

storing a data input signal and providing said data input signal, so stored, as a data output signal in response to transitions of said data clock signal; and storing a scan data input signal and providing said scan data input signal, so stored, as said data output signal in response to transitions of said scan clock signal.

17. The method of claim 16 further comprising performing said storing said data input signal and said storing said scan data input signal using sense amplifier flip-flop.

18. The method of claim 16 further comprising performing said storing said data input signal and said storing said scan data input signal using an asymmetric precharged flip-flop.

19. The method of claim 18 wherein said performing said storing said data input signal and said storing said scan data input signal using said asymmetric precharged flip-flop comprises performing an integral logic function.

20. The method of claim 16 further comprising performing said storing said data input signal and said storing said scan data input signal using a master-slave flip-flop.

\* \* \* \* \*